United States Patent [19]
Wingo

[11] Patent Number: 6,081,242
[45] Date of Patent: Jun. 27, 2000

[54] ANTENNA MATCHING CIRCUIT

[75] Inventor: Donald E. Wingo, Statham, Ga.

[73] Assignee: Galtronics U.S.A., Inc., Athens, Ga.

[21] Appl. No.: 09/098,270

[22] Filed: Jun. 16, 1998

[51] Int. Cl.$^7$ .................................................. H01Q 1/50
[52] U.S. Cl. ............................ 343/860; 343/702; 333/32
[58] Field of Search .................................. 343/702, 713, 343/860, 861; 333/32, 17.3

[56] References Cited

U.S. PATENT DOCUMENTS

| 5,212,492 | 5/1993 | Jesman et al. | 343/713 |
|---|---|---|---|
| 5,493,311 | 2/1996 | Itoh et al. | 343/860 |
| 5,594,457 | 1/1997 | Wingo | 343/702 |
| 5,699,071 | 12/1997 | Urakami et al. | 343/860 |
| 5,867,127 | 2/1999 | Black et al. | 343/860 |

FOREIGN PATENT DOCUMENTS

| 405055944 | 3/1993 | Japan | 343/860 |
|---|---|---|---|
| 9633522 | 10/1996 | WIPO . | |
| 9807208 | 2/1998 | WIPO . | |

*Primary Examiner*—Tan Ho
*Attorney, Agent, or Firm*—Ladas & Parry

[57] ABSTRACT

A matching circuit for an antenna, including a printed circuit substrate and an inductor, coupled to the antenna, made by printing a trace on a surface of the substrate. A first capacitor is formed in series with the inductor by creating a gap in the inductor trace. Preferably, the inductor shunts the antenna to ground, and a second capacitor is coupled in series with the antenna.

12 Claims, 2 Drawing Sheets

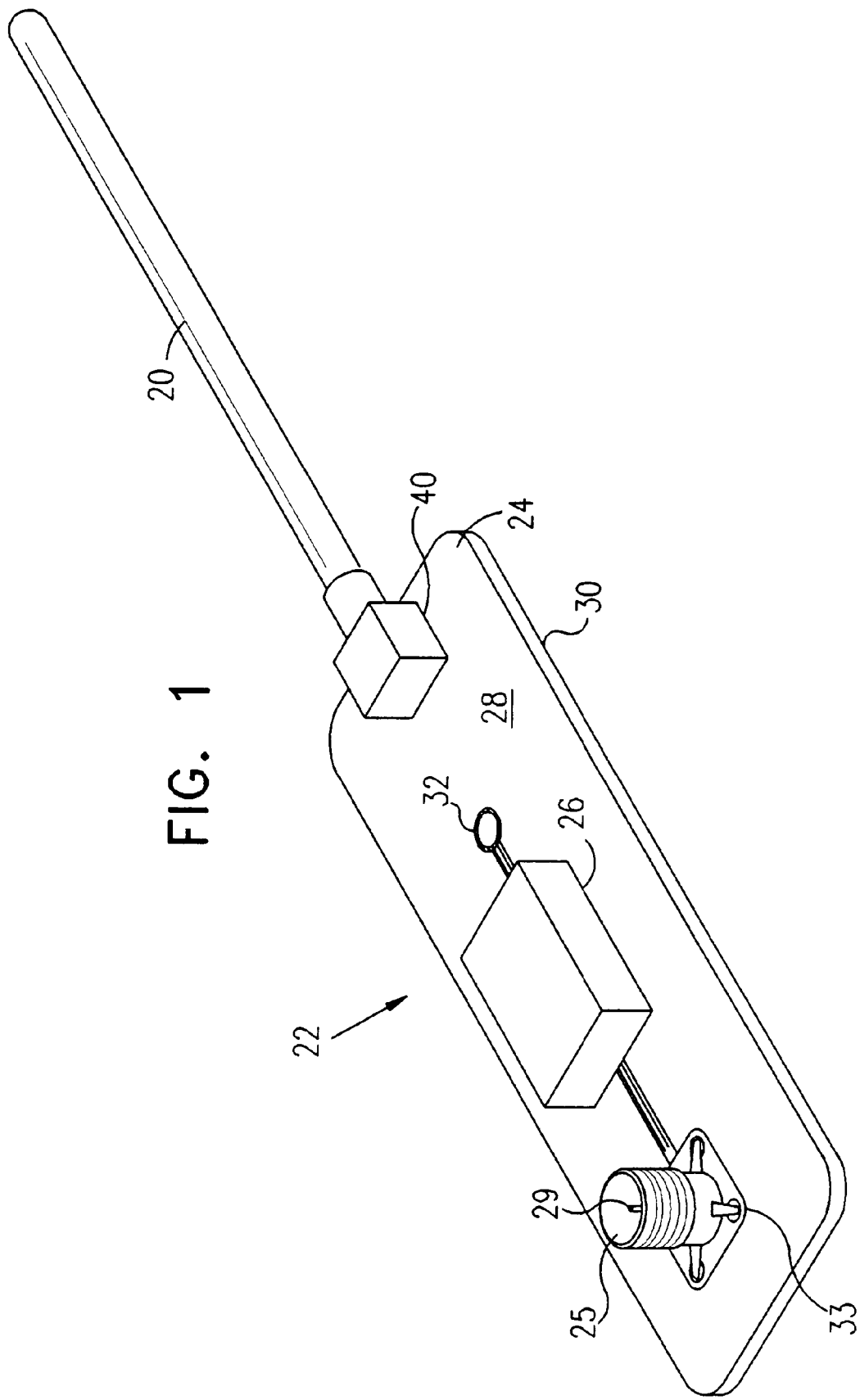

ANTENNA MATCHING CIRCUIT

FIELD OF THE INVENTION

The present invention relates generally to wireless radio communications, and specifically to antenna matching circuits for portable communication devices.

BACKGROUND OF THE INVENTION

A wide variety of antenna matching circuits are known in the art of wireless radio communications. Such matching circuits must provide good impedance matching, and thus efficient energy transfer, between an antenna and transmitter/receiver circuits at a particular design frequency or, more commonly, over a design frequency band. When used in portable communication devices, antennas and matching circuits must typically meet additional constraints with regard to their size and weight.

PCT patent publication WO 98/07208, which is incorporated herein by reference, describes an antenna matching circuit produced using printed circuit techniques. The circuit includes an inductor and capacitor which are formed by printing conductive material on a dielectric substrate. The inductor is made of a serpentine or spiral conductive strip on one side of the substrate. The capacitor is formed by parallel conductive plates on opposing surfaces of the substrate. The matching circuit is integrated with an antenna for use with a wireless modem, which plugs into a PCMCIA slot of a portable computer.

SUMMARY OF THE INVENTION

It is an object of the present invention to provide an improved antenna matching circuit for use with a portable wireless communications device.

In preferred embodiments of the present invention, an antenna matching circuit, which couples an antenna to a transmitter/receiver, comprises a miniature printed circuit board. The circuit comprises an inductor, preferably a shunt inductor, and first and second capacitors. The inductor is formed by printing a conductive trace on a dielectric substrate of the printed circuit board. The first capacitor, in series with the inductor, is formed by making a break in the inductor trace. The second capacitor, preferably a discrete capacitor, is preferably connected in series between the antenna and the transmitter/receiver.

Although printed inductors are known in the art, the addition of a series capacitance by breaking the inductor trace is novel. The combination of the series capacitance of the second capacitor with a suitably-selected value of the first, preferably discrete, capacitor affords greater design freedom than is possible using printed matching circuits known in the art, such as that described in the above-mentioned PCT publication WO 98/07208. As a result, the principles of the present invention may be applied to produce extremely small matching circuits that give good impedance matching over a relatively broad frequency band.

There is therefore provided, in accordance with a preferred embodiment of the present invention, matching circuit for an antenna, including:

a printed circuit substrate;

an inductor, coupled to the antenna and including a trace printed on a surface of the substrate; and a printed capacitor, in series with the inductor, formed by creating a gap in the inductor trace.

Preferably, the inductor shunts the antenna to ground.

Further preferably, the circuit includes a second capacitor, most preferably a discrete capacitor, coupled in series with the antenna. Preferably, the second capacitor is placed on a surface of the substrate opposite the surface on which the inductor is printed. Preferably, the second capacitor is coupled to the inductor trace by a conductor passing through the substrate at a through-point, wherein the through-point intersects the inductor trace adjacent to the gap therein.

There is further provided, in accordance with a preferred embodiment of the present invention, a method for impedance matching of an antenna, including:

providing a printed circuit substrate;

printing a trace on the substrate to form an inductor;

coupling the inductor to the antenna; and forming a gap in the inductor trace to apply a capacitance in series with the inductor.

Preferably, coupling the inductor includes shunting the antenna to ground.

Preferably, the method includes coupling a capacitor, most preferably a discrete capacitor, in series with the antenna.

The present invention will be more fully understood from the following detailed description of the preferred embodiments thereof, taken together with the drawings in which:

BRIEF DESCRIPTION OF THE DRAWINGS

FIG. 1 is a schematic, pictorial illustration showing an antenna and a matching circuit, in accordance with a preferred embodiment of the present invention;

DETAILED DESCRIPTION OF A PREFERRED EMBODIMENT

Figure 2A:
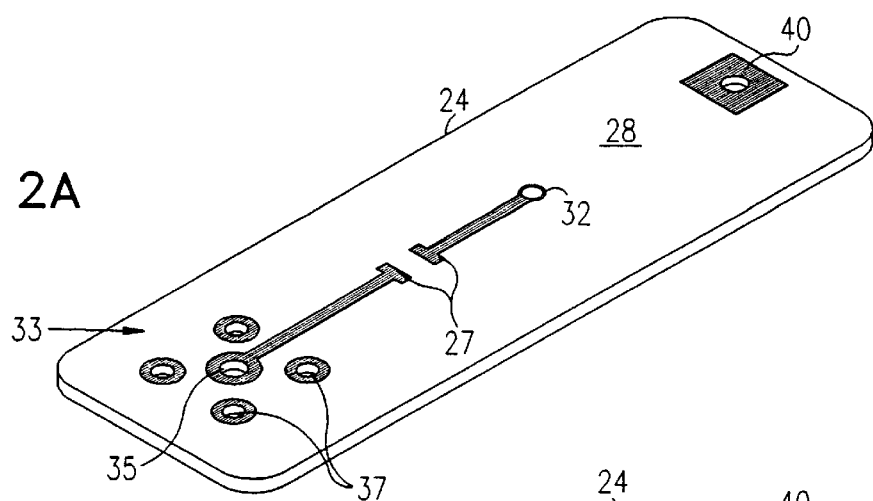
FIGS. 2A and 2B are schematic, pictorial illustrations showing first and second sides of a printed circuited board used in the matching circuit of FIG. 1, in accordance with a preferred embodiment of the present invention.

FIG. 1 is a schematic, pictorial illustration showing an antenna 20 coupled at a connection pad 40 to a matching circuit 22, in accordance with a preferred embodiment of the present invention. Circuit 22 comprises a miniature printed circuit board 24, having a discrete capacitor 26, preferably a 1.3 pF surface-mounted capacitor, on a first side 28 thereof. Other elements of circuit 22 are described hereinbelow. A connector 25, preferably a coaxial sub-miniature connector, as is known in the art, is fixed to board 24 at connector pads 33. The connector serves to connect antenna 20, via circuit 22, to a suitable transmitter/receiver circuit, for example, in a wireless modem device for use with a personal computer (not shown in the figures)

In the preferred embodiment described herein, antenna 20 comprises a half-wave antenna in the 824 to 894 MHz frequency band, which is commonly used in cellular telephony and other wireless applications. Connector 25 is characterized by a 50 ohm impedance, and circuit 22 provides matching between the (high-impedance) antenna and the 50 ohm connector over substantially the entire band. The antenna and matching circuit are preferably packaged together in an integrated package (not shown), most preferably with an insulating overmolding, having an overall length of about 12–13 cm and a diameter of about 7.0 mm. It will be appreciated, however, that the elements and principles of the present invention may similarly be employed in other applications, configurations and frequency bands.

Figure 2B:
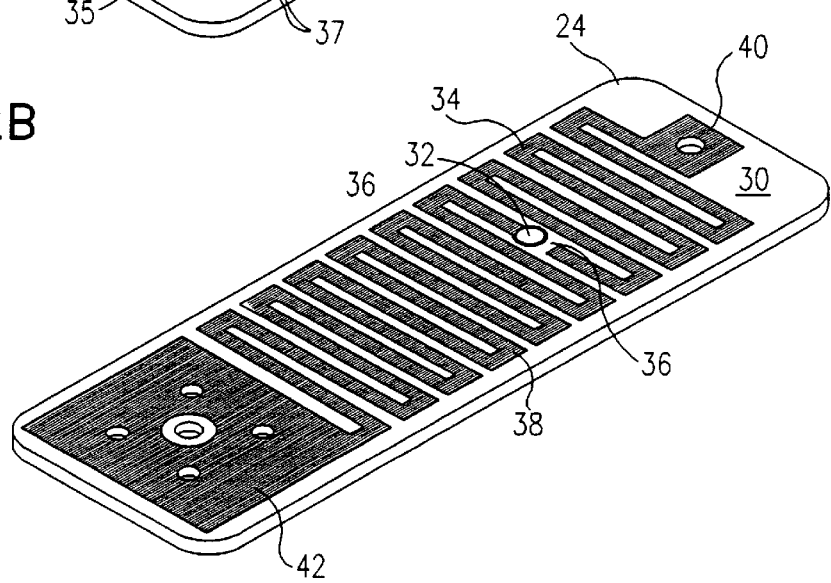

FIGS. 2A and 2B are schematic, pictorial illustrations respectively showing first side 28 and a second, opposite side 30 of board 24, in accordance with a preferred embodiment of the present invention. Capacitor 26 (FIG. 1) is soldered between pads 27 on side 28. In this manner, one terminal of the capacitor is connected via a central pad 35 of connector pads 33 to a central pin 29 of connector 25. The other terminal of capacitor 26 is connected via a plated-through hole 32 to an inductor trace 34 on side 30 of the board. Trace 34 includes a gap 36, forming an additional capacitor. On one side of the gap, trace 34 provides a connection between antenna pad 40 and capacitor 26, through hole 32. On the other side of the gap, the trace forms an inductor 38, between hole 32 and a ground plane 42, which is connected to outer (ground) pads 37 of connector pads 33.

In the preferred embodiment described herein, board 24 comprises a dielectric substrate, such as a laminated epoxy material, with copper conductors printed on sides 28 and 30, in accordance with printed circuit production methods known in the art. It will be appreciated, however, that the principles of the present invention may similarly be implemented using any suitable sort of substrate, conductors and printed wiring technique.

Figure 3:
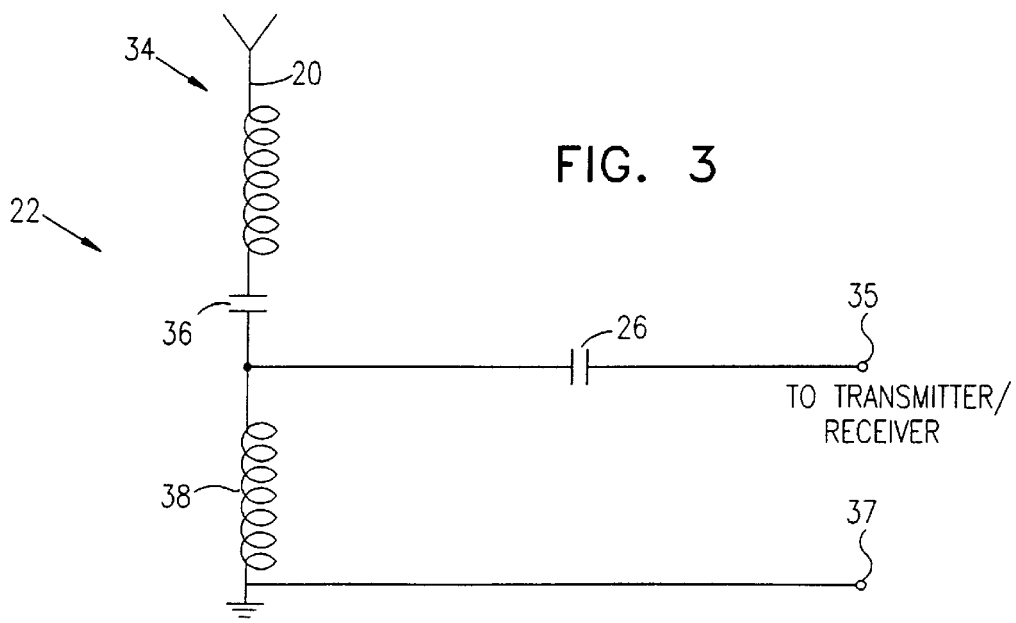
FIG. 3 is an schematic circuit diagram corresponding to the antenna and matching circuit of FIG. 1.

FIG. 3 is an electrical schematic diagram showing a simplified equivalent circuit of antenna 20 and matching circuit 22. Antenna 20 is shunted via capacitor 36 and inductor 38 to ground, and is coupled via series capacitor 26 to the transmitter/receiver. The value of inductor 38 is determined by structural and geometric factors, and is typically in the range of 12 nH. The inventors have found that the addition of capacitor 36 in series with inductor 38, by forming the gap in trace 34, brings antenna 20 into resonance, preferably at the lower end of the above-mentioned 824–894 MHz band. The design flexibility afforded by the combination of capacitors 26 and 36 and inductor 38 (whose length, and therefore inductance, may be varied by changing the position of hole 32) enables relatively low return loss to be maintained over the entire band, typically with less than −9.5 dB loss at the upper band edge. Circuit 22 thus affords substantially improved energy transfer between antenna 20 and the transmitter/receiver relative to compact printed matching circuits known in the art.

It will be evident to those skilled in the art that the inventive concept of making a break in an inductor trace in order to add a capacitance in series therewith will be applicable in other types of impedance matching networks, as well. This concept has the advantage of allowing a small capacitance to be added and adjusted, without necessitating the addition of discrete circuit elements or soldered-in "patches." It will thus be appreciated that the preferred embodiment described above is cited by way of example, and the full scope of the invention is limited only by the claims.

What is claimed is:

1. A matching circuit for an antenna, comprising:

a printed circuit substrate;

an inductor, coupled to the antenna and comprising a trace printed on a surface of the substrate; and a printed capacitor, in series with the inductor, formed by creating a gap in the inductor trace.

2. A circuit according to claim 1, wherein the inductor shunts the antenna to ground.

3. A circuit according to claim 1, and comprising a second capacitor coupled in series with the antenna.

4. A circuit according to claim 3, wherein the second capacitor comprises a discrete capacitor.

5. A circuit according to claim 3, wherein the second capacitor is placed on a surface of the substrate opposite the surface on which the inductor trace is printed.

6. A circuit according to claim 5, wherein the second capacitor is coupled to the inductor trace by a conductor passing through the substrate at a through-point.

7. A circuit according to claim 6, wherein the through-point intersects the inductor trace adjacent to the gap therein.

8. A circuit according to claim 3, wherein the inductor shunts the antenna to ground.

9. A method for impedance matching of an antenna, comprising:

providing a printed circuit substrate;

printing a trace on the substrate to form an inductor;

coupling the inductor to the antenna; and forming a gap in the inductor trace to apply a capacitance in series with the inductor.

10. A method according to claim 9, wherein coupling the inductor comprises shunting the antenna to ground.

11. A method according to claim 9, and comprising coupling a capacitor in series with the antenna.

12. A method according to claim 11, wherein coupling the capacitor comprises coupling a discrete capacitor to the antenna.

* * * * *